(12) United States Patent
Ponce et al.

(10) Patent No.: US 7,255,844 B2
(45) Date of Patent: Aug. 14, 2007

(54) SYSTEMS AND METHODS FOR SYNTHESIS OF GALLIUM NITRIDE POWDERS

(75) Inventors: Fernando A. Ponce, Tempe, AZ (US); Rafael Garcia, Tempe, AZ (US); Abigail Bell, Northamptonshire (GB); Alan C. Thomas, Gilbert, AZ (US); Michael R. Stevens, Phoenix, AZ (US)

(73) Assignee: Arizona Board of Regents, Tempe, AZ (US)

( * ) Notice: Subject to any disclaimer, the term of this patent is extended or adjusted under 35 U.S.C. 154(b) by 238 days.

(21) Appl. No.: 10/997,254

(22) Filed: Nov. 24, 2004

(65) Prior Publication Data

US 2005/0238562 A1 Oct. 27, 2005

Related U.S. Application Data

(60) Provisional application No. 60/525,065, filed on Nov. 24, 2003.

(51) Int. Cl.
*C01B 21/06* (2006.01)
(52) U.S. Cl. .................................................. 423/409
(58) Field of Classification Search ................ 423/409
See application file for complete search history.

(56) References Cited

U.S. PATENT DOCUMENTS 5,021,134 A * 6/1991 Blackburn et al. .......... 204/177
6,096,282 A 8/2000 Kaner et al.

OTHER PUBLICATIONS

"Synthesis of gallium nitride by ammonia injection into gallium melt", M. Shibata et al, Journal of Crystal Growth 196 (1997) 47-52, no month.*
"Solvothermal synthesis: a new routew for preparing nitrides", G. Demazeau et al, J.Phys.: Condens. Matter 14 (2002) 11085-11088, no month.*
Barry, S. et al, "Gallium Nitride Synthesis Using Lithium Metal as a Nitrogen Fixant", Chem. Mater., 1998, p. 2571-2574, vol. 10, no month.
Bell A. et al, "Photoluminescence spectroscopy on annealed molecular beam epitaxy grown GaN," Journal of Applied Physics, Jan. 15, 1998, vol. 89, No. 2.
Cazzanelli M. et al, "Luminescent properties of GaN thin films prepared . . .," Materials Science and Engineering, 1999, p. 137-140, vol. B59, no month.
Cazzanelli, M. et al, "Photoluminsecence of localized excitons in pulsed-laser-deposited GaN," Applied Physics Letters, Dec. 7, 1998, p. 3390-3392, vol. 73, No. 23.
Chung, B. et al, "The influence of oxygen on the electrical and optical properties of GaN crystals . . .," Journal of Applied Physics, Jul. 15, 1992, p. 651-659, vol. 72, No. 2.

(Continued)

*Primary Examiner*—Wayne A. Langel
(74) *Attorney, Agent, or Firm*—McDonnell Boehnen Hulbert & Berghoff

(57) ABSTRACT

A method of producing high quality GaN powder by combining high purity gallium and high purity ammonia in a tube reactor under controlled conditions. A reaction between the ammonia and gallium under the controlled conditions produces a porous gallium melt and to a full reaction, yielding high purity crystalline GaN powders with a stoichiometric nitrogen concentration and a hexagonal wurtzite structure.

9 Claims, 5 Drawing Sheets

OTHER PUBLICATIONS

Dovidenko, K. et al, "Study of Thin Films Polarity of Group III Nitrides," MRS Internet J. Nitride Semicond. Res. 4S1, G6,46 (1999), no month.

Dwilinski, R. et al, "AMMONO method of GaN and AlN production," Diamond and Related Materials, May 18, 1998, p. 1348-1350, vol. 7.

Eshiet, U., "The Growth and Characterization Processes of Gallium Nitride (GaN) Nanowires," National Nanofabrication Users Network, p. 34-35, no month.

Garcia, R., "A novel method of synthesis of sub-microcrystalline wurtzite-type . . . , " Materials Science and Engineering, 2002, p. 7-12, vol. B90, no month.

Garcia, R., "Synthesis, Structure and Luminescence of High Brightness Gallium Nitride Powder," Mat. Res. Soc. Symp. Proc., 2004, p. Y10.75.1-Y10.75.6, vol. 798.

Gonzalves, K.E. et al, "Optical and microstructural characterization of chemically synthesized gallium . . . ," Applied Physics Letter, Oct. 13, 1997, p. 2175-2177, vol. 71, No 15.

Hirata, G.A. et al, "A New Combustion Synthesis Method for Luminescent Powders," Phys. Stat. Sol., 2001, p. 179-182, vol. (a) 188, No. 1, no month.

Honda, T. et al, "Cathodoluminescence Spectra of GaN powders deposited on glass substrate," Journal of Luminescence, 2003, p. 173-175, vol. 102-103, no month.

Kamler, G. et al, "Bulk GaN single-crystals growth," Journal of Crystals Growth, 2000, p. 39-48, vol. 212, no month.

Kaufmann, U. et al, "Nature of the 2.8 eV photoluminescence band in Mg doped GaN," Applied Physics Letter, Mar. 16, 1998, p. 1326-1328, vol. 72, No. 11.

Kim, W. et al, "Effect of Ammonia Flow Rate on Impurity Incorporation and Material . . . ," Journal of Applied Physics, Dec. 15, 1998, p. 6680-6685, vol. 84, No. 12.

Kim, W. et al, "On the incorporation of Mg and the role of oxygen, silicon . . . ," Journal of Applied Physics, Jul. 1, 1997, p. 219-226, vol. 82, No. 1.

Li, H.D. et al, "Synthesis of Ultrafine Gallium Nitride Powder by the Direct . . . ," Applied Physics Letter, Aug. 26, 1996, p. 1285-1287, vol. 69, No. 9.

Mayer, M. et al, "Improved Gallium Cell Reliability: Using the Ga SUMO Source . . . ," VEECO, Apr. 1998, Note Jan. 1998.

Monemar, B., "Basic III-V nitride research-past, present and future," Journal of Crystal Growth, 1998, p. 1-7, vol. 189-190, no month.

Monemar, B. "Bound Exciton in GaN," Journal of Physics: Condensed Matter, 2001, p. 7011-7026, vol. 13, IOP Publishing Ltd, UK, no month.

Nakarmi, M.L., "Enhanced p-type conduction in GaN and AlGaN by . . . ," Appied Physics Letters, May 5, 2003, p. 3041-3043, vol. 82, No. 18.

Neugebauer, J. et al, "Gallium vacancies and the yellow luminescence in GaN," Applied Physics Letter, Jul. 22, 1996, p. 503-505, vol. 69, No. 4.

Reynolds, D.C. et al, "Source of the Yellow Luminescence Band In GaN Grown . . . ," Solid State Communications, 1998, p. 701-704, vol. 106, No. 10, Elsevier Science Ltd, Great Britain, no month.

Pankove, J.I. et al, "Properties of Zn-doped GaN. I. Phototluminescence," Journal of Applied Physics, Mar. 3, 1974, p. 1280-1286, vol. 45, No. 3.

Ponce, F.A. et al, "Nitride-based semiconductors for blue and green light-emitting devices," Nature, Mar 27, 1997, p. 351-359, vol. 386.

Rabane, Y.T. et al, "Stacking Faults as Quantum Wells for Excitons in Wurtzite GaN," Phys. Stat. Sol, 1997, p. 141-144, vol. (a) 164, no month.

Scheel, H.J., "The Development of Crystal Growth Technology," Crystal Growth Technology, 2003, p. 3-14, John Wiley & Sons, Ltd, no month.

Shibata, M. et al, "Synthesis of gallium nitride by ammonia injection . . . ," Journal of Crystal Growth, 1999, p. 47-52, vol. 196, no month.

Suski, T. et al, "Mechanism of Yellow Luminescence in GaN," Applied Physics Letter, Oct. 9, 1995, p. 2188-2190, vol. 67, No. 15.

Tanaka, A. et al, "GaN crystal growth on an SiC substrate from Ga wetting solution reacting with NH3," Journal of Crystal Growth, 2003, p. 59-64 vol. 249, no month.

Tsao, J., "Solid-State Lighting: Lamps, Chips and Materials for Tommorow," IEEE Circuits and Devices, May/Jun. 2004, p. 28-38, vol. 20, No. 3.

Van De Walle, C.G. et al, "Theory of doping and defects in III-V nitrides," Journal of Crystal Growth, 1998, p. 505-510, vol. 189/190, no month.

Wang, L.D. et al, "Cubic aluminum nitride and gallium nitride thin films . . . ," Applied Surface Science, 2000, p. 439-443, vol. 154-155, no month.

Wright, A.F., "Interaction of hydrogen with gallium vacancies in wurtzite GaN," Journal of Applied Physics, Aug. 1, 2001, p. 1164-1169, vol. 90, No. 3.

Xiao, R.F et al, "Growth of c-axis oriented gallium nitride thin films on an amorphous substrate . . . ," Journal of Applied Physics, Oct. 1, 1998, p. 4226-4228, vol. 80, No. 7.

Zhi, C.Y. et al, "GaN-filled carbon nanotubes: synthesis and photoluminescence," Chemical Physics Letters, 2003, p. 715-719, vol. 381, no month.

The 14th Int'l Conference on Crystal Growth, Aug. 9-13, 2004, Alpes Congres, Grenoble, France.

Lorenz, et al., (1962), "Preparation, Stability, and Luminescence of Gallium Nitride", Journal of the Electrochemical Society. Manchester, New Hampshire, U.S., vol. 109, pp. 24-26, no month.

Trehan, et al., (1997), "Preparation and Charaterization of Gallium Nitride Powder", Physics of Semiconductor Devices, vol. 2, pp. 1318-1322, no month.

* cited by examiner

SYSTEMS AND METHODS FOR SYNTHESIS OF GALLIUM NITRIDE POWDERS

CROSS REFERENCE TO RELATED APPLICATIONS

This application is a non-provisional application, which claims benefit of priority under 35 U.S.C. § 119(e) of U.S. Provisional Application No. 60/525,065 filed Nov. 24, 2003, and entitled "Two-Step Process for Direct Synthesis of Gallium Nitride Powders," incorporated herein by reference.

FIELD OF THE INVENTION

This invention relates to systems and methods for semiconductor powders, and more particularly to such systems and methods for producing gallium nitride powders.

BACKGROUND OF THE INVENTION

Gallium nitride semiconductors are useful in, among other things, high power electronic and optoelectronics, such as flat panel displays, light emitting diodes, and laser diodes. While most gallium nitride ("GaN") materials are produced as thin films, GaN powders have applications as electroluminescent phosphor. The first reported synthesis of GaN powder was described by Johnson, W. C., Parsons, J. B., Crew, M. C., "Nitrogen Compounds of Gallium" *J. Phys. Chem.*, 36, 2651-54 (1932) by flowing ammonia over molten gallium heated between 900-1000° C., which caused the following reaction:

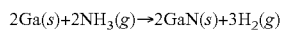

$$2Ga(s) + 2NH_3(g) \rightarrow 2GaN(s) + 3H_2(g)$$

Subsequent research described the efficiency of the above-described process. Pichugin, I. G., Yaskov, D. A., "Preparation of Gallium Nitride," *Inorg. Mater.*, 6, 1732-34 (1972) reported an experiment that caused a reaction on the surface of gallium melt (also referred herein as "Ga melt") resulting in the formation of grayish colored GaN. Despite an excess of available ammonia much of the gallium melt remained under the crust of GaN created by the reaction, thus requiring several additional stages in order to achieve full reaction. Moreover, impurities such as residual gallium metal and gallium oxide were present in the as synthesized GaN powder, which adversely affected its optoelectronic properties.

SUMMARY OF THE INVENTION

The preferred embodiments of the present invention relate to a process of producing gallium nitride ("GaN") powders that possess improved luminescent properties. The process according to the preferred embodiments provides high control of the parameters of the process, including reactants, products, temperature and pressure. The improved process generally includes, as an intermediate step, exposing gallium melt to an ammonia flow to dissolve ammonia into the liquid gallium.

In one aspect of the invention, gallium melt is exposed to an ammonia flow at temperatures in the range from 200° C. to 700° C. for a period of time ranging from a few minutes at higher temperatures (e.g., at 700° C.) to a few hours at lower temperatures (e.g., at 200° C.). Ultra-high purity gallium (e.g., 99.9995 weight %) and ammonia (e.g., 99.9995 weight %) are used. The resulting reaction occurs in a highly controlled horizontal quartz tube reactor at about 1100° C., which advantageously, promotes a formation of liquid gas solution that improves the reaction.

It is a further aspect of the invention to provide a method to produce high quality GaN powders, which includes providing gallium metal and ammonia at a medium temperature (e.g., about 700° C.) in an ultra-pure ammonia atmosphere in order to form a gas-liquid saturate solution.

A further aspect of the invention is to provide a process in which different quality of GaN powders can be obtained under temperatures in the range of 800 to 1200° C. by the same process.

Another aspect of the invention is to provide GaN powder substantially free of residual gallium or gallium oxide.

For purposes of summarizing the invention, certain aspects, advantages and novel features of the invention have been described above. It is to be understood, however, that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

The preferred embodiments of the present invention will be described below in connection with the attached drawings in which.

DETAILED DESCRIPTION

Although certain preferred embodiments and examples are disclosed below, it will be understood by those skilled in the art that the invention extends beyond the specifically disclosed embodiments to other alternative embodiments and uses of the invention and obvious modifications and equivalents thereof. Thus, it is intended that the scope of the invention should not be limited by the particular embodiments disclosed herein. For instance, the preferred method is not limited by the exact sequence of acts described, nor is it limited to the practice of all of the acts set forth. Other sequences of events or acts, or less than all the events, or simultaneous occurrences of the events, may be utilized in practicing the method(s) in question.

General Description

The preferred methods of producing GaN generally include combining gallium melt and ammonia under controlled conditions. The preferred methods advantageously produce a substantially complete reaction of the Ga melt, thereby optimizing the yield of GaN and also resulting in GaN powders with improved luminescent properties. For example, in a preferred embodiment, large amounts of stoichiometric GaN powder (e.g., about 10 grams/batch) are produced using ultra-high purity precursors (e.g., gallium 99.9995 weight % and ammonia 99.9995 weight %) under controlled parameters (e.g., temperature, pressure, gas-flow and time).

Elemental analysis using energy dispersive spectroscopy ("EDS") has established the high purity of the improved GaN powder. The GaN powders produced by the preferred methods are typically: light gray in color, and formed by micro-crystals having two different particle size distributions and have a hexagonal structure (i.e. wurtzite structure), as demonstrated by scanning electron microscopy ("SEM"), high resolution transmission electron microscopy ("HR-TEM") and X-ray diffraction analysis ("XRD"). Also, cathodoluminescence ("CL") and photoluminescence ("PL") analysis demonstrated that the GaN powders produced by the preferred methods are advantageously extraordinarily luminescent.

Preferred Method of Producing GaN

A preferred method of producing high-quality GaN is disclosed below. The following method is provided by way of illustration only and not by way of limitation. Those of skill in the art will readily recognize a variety of noncritical parameters that could be changed or modified to yield essentially similar results.

Figure 1:
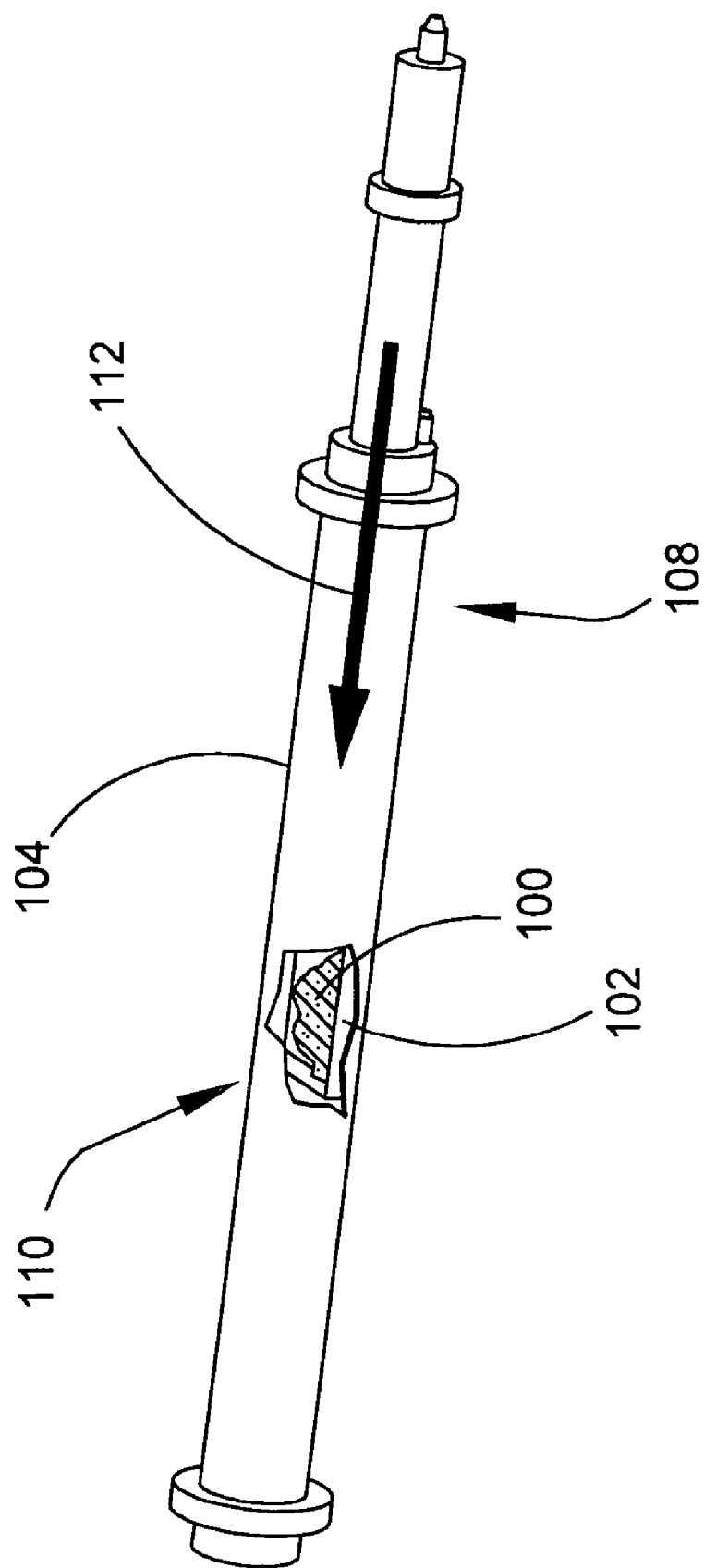
FIG. 1 is a simplified schematic illustration of a vessel containing gallium metal located inside a reactor tube.

With reference to FIG. 1, an amount of gallium metal 100 is poured into a vessel 102, such as a commercially available high-alumina boat. The gallium metal 100 is preferably heated prior to being poured into the vessel 102 in the range between 50° C. and 100° C., most preferably about 70° C. The gallium metal 100 is preferably of a purity ranging between 99.99 weight % and 99.9999 weight %, and most preferably of an ultra-high purity, such as about 99.9995 weight %. For purposes of this description of one preferred method, between 1 and 10 grams of gallium metal 100 may be poured into the vessel 102, however, the amount may be more or less, depending upon the desired output quantity.

The vessel 102 containing the gallium metal is placed into a tube reactor 104 having a temperature ranging between 15° C. and 100° C., most preferably at 25° C. The tube reactor may be, for example, a horizontal quartz tube reactor consisting of a fused silica tube (3.5 cm inner diameter and 120 cm length) with stainless steel flanges at both sides, which is introduced into a Lindberg tube furnace (80 cm length) with a maximum operating temperature of 1200° C. The fused silica tube is connected through its flanges with a gas supply system at the entrance and a vacuum system at the exit. An explanation of tube reactors is disclosed in R. Garcia, et al, "A novel method for the synthesis of sub-microcrystalline wurtzite-type $In_xGa_{1-x}N$ powders," *Materials Science and Engineering (B): Solid State Materials for Advanced Technology*, B90, 7-12 (2002), incorporated herein by reference. Of course, other types of reactors or equivalent devices may be used, as is known.

Figure 2:
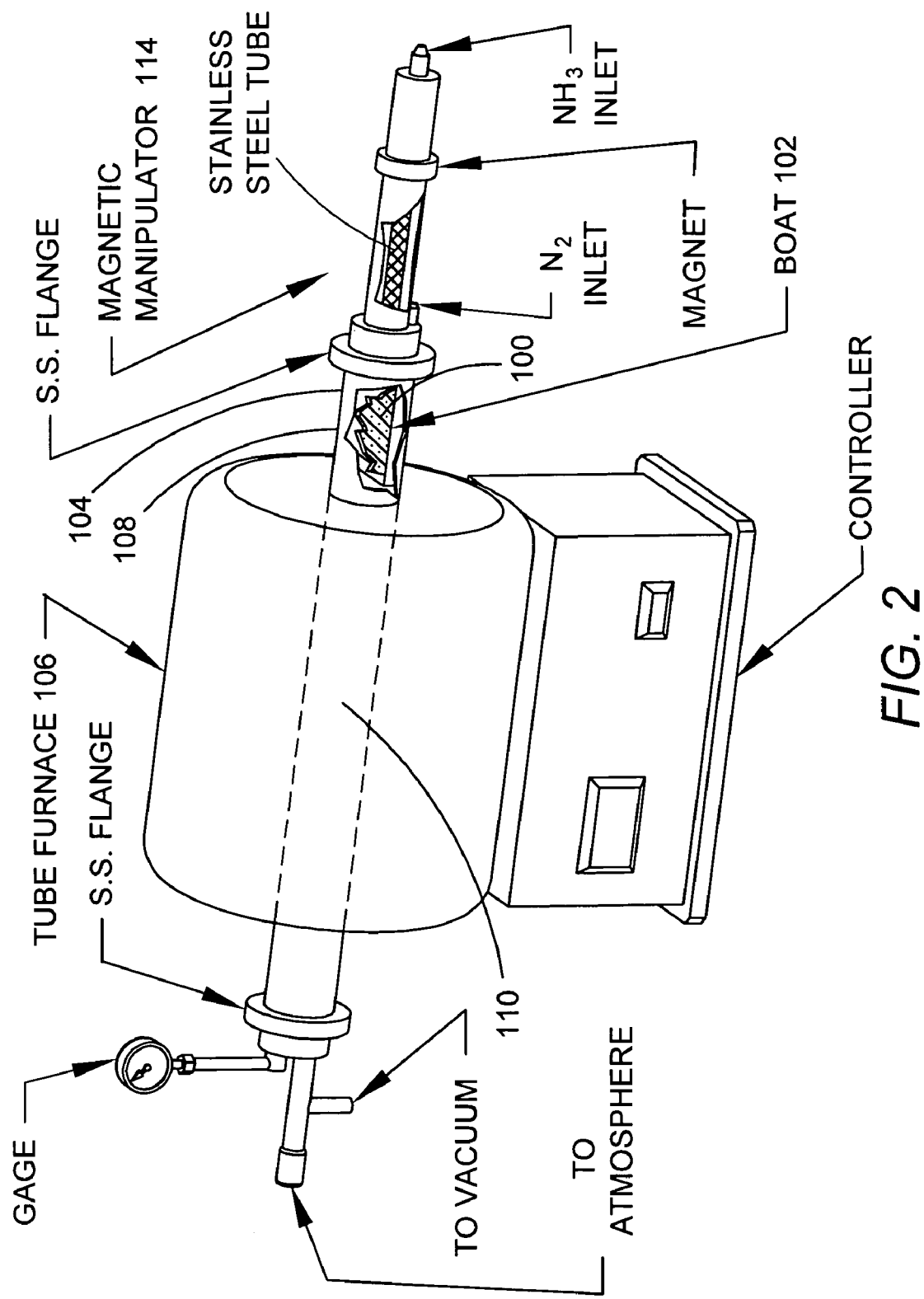
FIG. 2 is a diagrammatic illustration of an installation of equipment used in the practice of the invention.

With reference to FIGS. 1 and 2, the tube reactor 104 is then tightly closed and evacuated (e.g., down to about 0.001 Torr) while simultaneously being heated in an electric furnace with the vessel 102 at a location near an entrance 108 of the tube reactor 104 (the location referred to as "the cold zone").

After about 30 minutes with the vessel 102 near the entrance 108 of the tube reactor 104, the gallium metal 100 reaches a temperature of about 200° C. and a middle section 110 of the tube reactor 104 (also referred to as "the hot zone") reaches a temperature of about 700° C. Once the above conditions are met, the vacuum process is suspended and, a flow of ammonia 112 (depicted as an arrow in FIG. 1) is conducted through the reactor at a rate of between 200 $cm^3$/min and 1000 $cm^3$/min, and most preferably at 350 $cm^3$/min. The ammonia flow 112 preferably comprises ammonia having a purity of between 99.99% and 99.9999%, most preferably ultra high purity of about 99.9995 weight %. The ammonia flow is conducted throughout the preheating and synthesis processes. The ammonia flow is stopped just when the final product (GaN powder) is at room temperature in the cold zone at the entrance 108 of the tube reactor 104.

Continuing with reference to FIG. 2, the vessel 102 then is transported to the hot zone 110 of the tube reactor 104 using a magnetic manipulator 114, as is known in the art. After an amount of time ranging from 20 to 60 minutes, and most preferably about 30 minutes, a gallium-ammonia solution forms in the vessel 102. Typically, the concentration of ammonia in the gallium-ammonia solution depends on the time and the temperature at which the vessel 102 is in the entrance 108 of the tube reactor 104.

Next, the vessel 102, with the gallium-ammonia solution, is placed once again in the cool zone 108 using the magnetic manipulator 114 and the furnace temperature is raised to a temperature ranging between 950° C. and 1200° C., and most preferably about 1100° C.

Working conditions are then established. The working conditions comprise: a temperature ranging between 1000° C. and 1200°, and most preferably 1100° C.; an ammonia flow ranging between 100 $cm^3$/min and 1000 $cm^3$/min, most preferably 500 $cm^3$/min; and a pressure inside the tube reactor in a range between 0.001 and 800 Torr, and most preferably about 760 Torr. These working conditions typically take about 30 minutes to establish.

Once the working conditions are established, the vessel 102 containing the gallium-ammonia solution is placed into the hot zone 110 of the tube reactor 104 using the magnetic manipulator 114. At this point, the reaction that produces gallium nitride ("GaN") typically occurs. Specifically, the ammonia dissolved in the gallium reacts with the gallium, forming voids and GaN. The resulting porous structure further facilitates the reaction of gallium with ammonia gas, producing more GaN.

Commonly, the reaction is complete after about one hour. The vessel 102, which now contains GaN, is then moved to the cool zone at the entrance 108 of the tube reactor 104, which has, at this point, a temperature of about 25° C.

After the GaN cools, the vessel 102 is taken out of the tube reactor 104 and the GaN is ground in a mortar, as is known, thereby fracturing any GaN structure to produce a GaN powder. The result is the improved GaN powder of the invention.

Analysis

An elemental analysis was carried out in a Perkin Elmer PE 2400 Series II CHNS/O Analyzer. The nitrogen concentration in the GaN powder measured by this equipment was 16.89 weight %. The calculated nitrogen concentration in the GaN should be, based on the initial constituents 16.73 weight %. Therefore the GaN powders synthesized in this work appear to be stoichiometric. Moreover, hydrogen, carbon, oxygen and sulfur were not detected in the improved GaN powder.

An EDS spectra of the improved GaN powder showed only two peaks corresponding to nitrogen (transition $K_\alpha$ at 0.392 keV) and gallium (transitions: $L_\alpha^1$ at 1.096 keV and $L_\beta^1$ at 1.122 keV). The indication of no other transitions indicates an absence of impurities, such as oxygen, within the detection limits of the instrument.

Figure 3A:
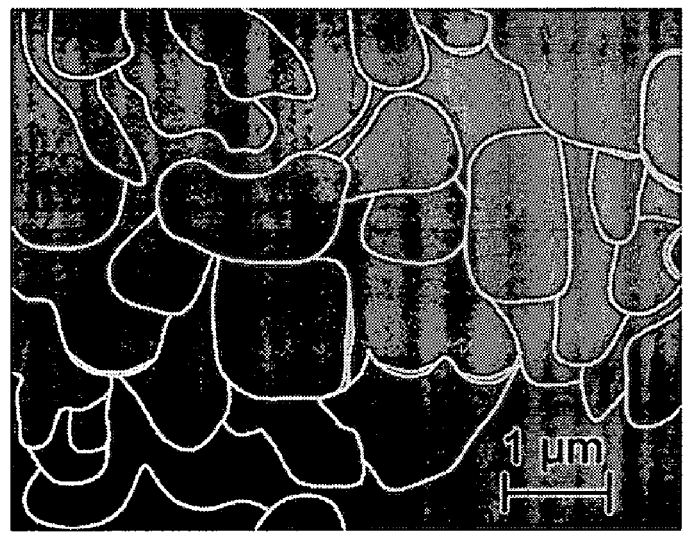
FIG. 3(a) is a SEM micrograph of platelets of GaN powder synthesized in accordance with a preferred method of the present invention.
Figure 4A:
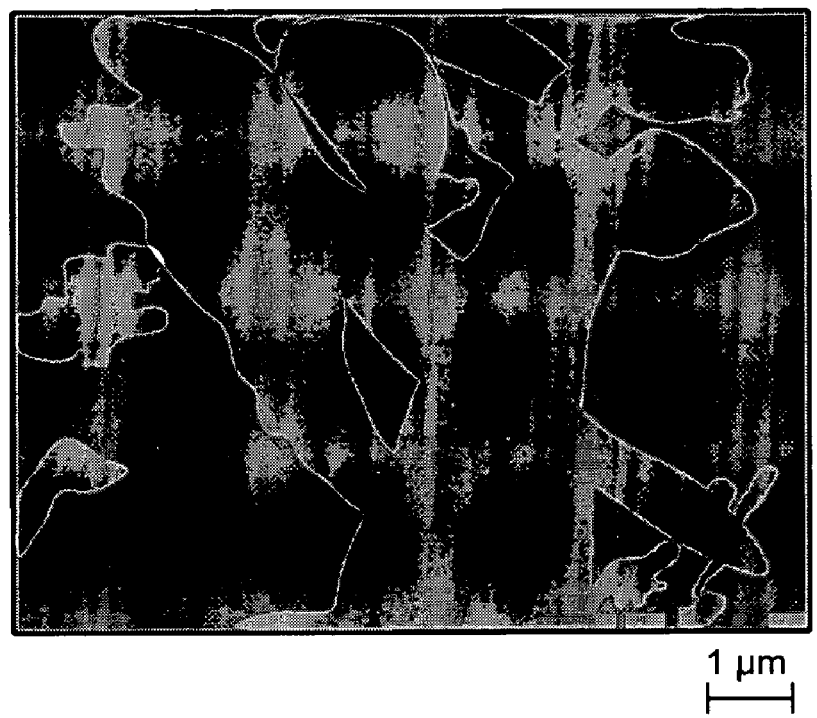
FIG. 4(a) is a SEM micrograph of needle-like GaN structures.

SEM images of the improved GaN powder were obtained with a Hitachi S-4700-11 field emission scanning electron microscopy. The powder is observed to have two predominant crystalline modifications shown in FIGS. 3(a) and 4(a). Whereas FIG. 3(a) shows predominantly small platelet particles with a particle size distributions between 0.5 and 2.0 μm; FIG. 4(a) shows large needle-like particles with hexagonal faces. The needle-like structures have a length between about 10 and 30 μm and a diameter between about 1 and 7 μm. Other particles with different morphologies (e.g., rectangular slab-like, truncated pyramids, etc.) were shown to be present in the improved GaN powder, but the hexagonal platelets and hexagonal needle-like structures were the predominant forms.

Figure 3B:
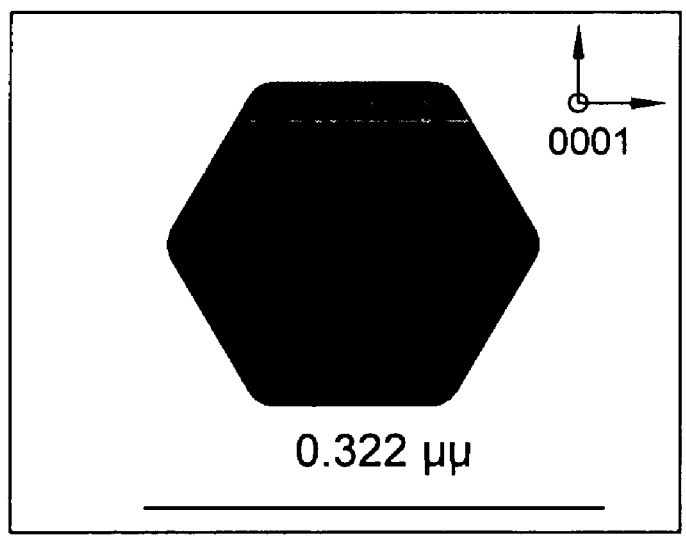
FIG. 3(b) is a TEM image of a GaN platelet showing six sharp <1000> facets and a high-resolution image.
Figure 4B:
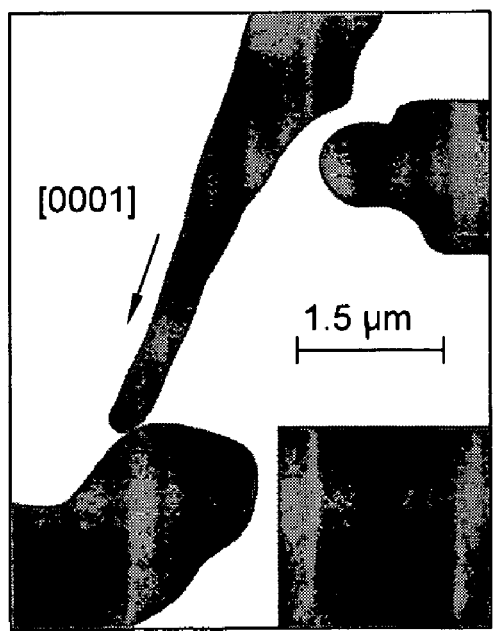
FIG. 4(b) is a TEM image of the GaN needle-like structure with the positive c axis indicated by the arrow and a corresponding diffraction pattern depicted in a lower-right corner of the figure.

Improved GaN powder samples were prepared for transmission electron microscopy and electron diffraction by sonication in methanol for about half an hour. FIG. 3(b) shows an image of a typical platelet and FIG. 4(b) shows a typical needle on [0001] and [1-100] zone axes respectively. The diffraction patterns indicate a single crystal orientation. Bright field images indicate very few defects in the interior regions of either the platelets or the needle-like microcrystals. From FIGS. 3(b) and 4(b), it is clear that the 60 degree facets seen in both figures correspond to the <1100> planes of the crystal. Convergent beam patterns taken of the needle-like structures suggest that they have gallium polarity (see arrow in FIG. 4(b)).

An x-ray diffraction analysis of the improved GaN showed a very well defined hexagonal wurtzite crystalline structure with lattice parameters very similar to those calculated in PDF card #76-0703. There are no other crystalline phases present such as oxides or pure metal, which demonstrates the high quality of the GaN powder as-synthesized by the preferred methods. The lattice parameters of GaN powder are in good agreement with values reported by Edgar, J. H., Properties of Group III Nitrides, INSPEC-IEEE, London, UK, 20-40 (1994 for hexagonal wurtzite structure as determined by an analytical method as disclosed in Cullity, B. D., Elements of X-Ray Diffraction, Addison-Wesley, USA, 324 (1978). Accordingly, the lattice parameters (a and c) were calculated by the relation: $\sin^2 \theta = A(h^2+hk+k^2)+Cl^2$, where $A=\lambda^2/3a^2$ and $C=\lambda^2/4c^2$ using the (200) and (002) planes.

A PL analysis showed two emission bands in the improved GaN powders. A first, stronger emission band is a near band-edge emission at about 372 nm (3.333 eV) and the second, weaker emission band is at about 420 nm (2.952 eV). A full width at half maximum (FWHM) of each of the two peaks is 12.67 nm and 11.9 nm, respectively. No yellow luminescence was observed in the improved GaN powders in a room temperature PL analysis.

By comparison, a PL analysis was also conducted on a commercially produced GaN powder samples (i.e. produced by previously known methods other than those used in the present invention) under different conditions (e.g., no filters were used and the slit was four times more wide than the first sample). The PL analysis indicated very weak broad luminescence at 369 nm.

Figure 5:
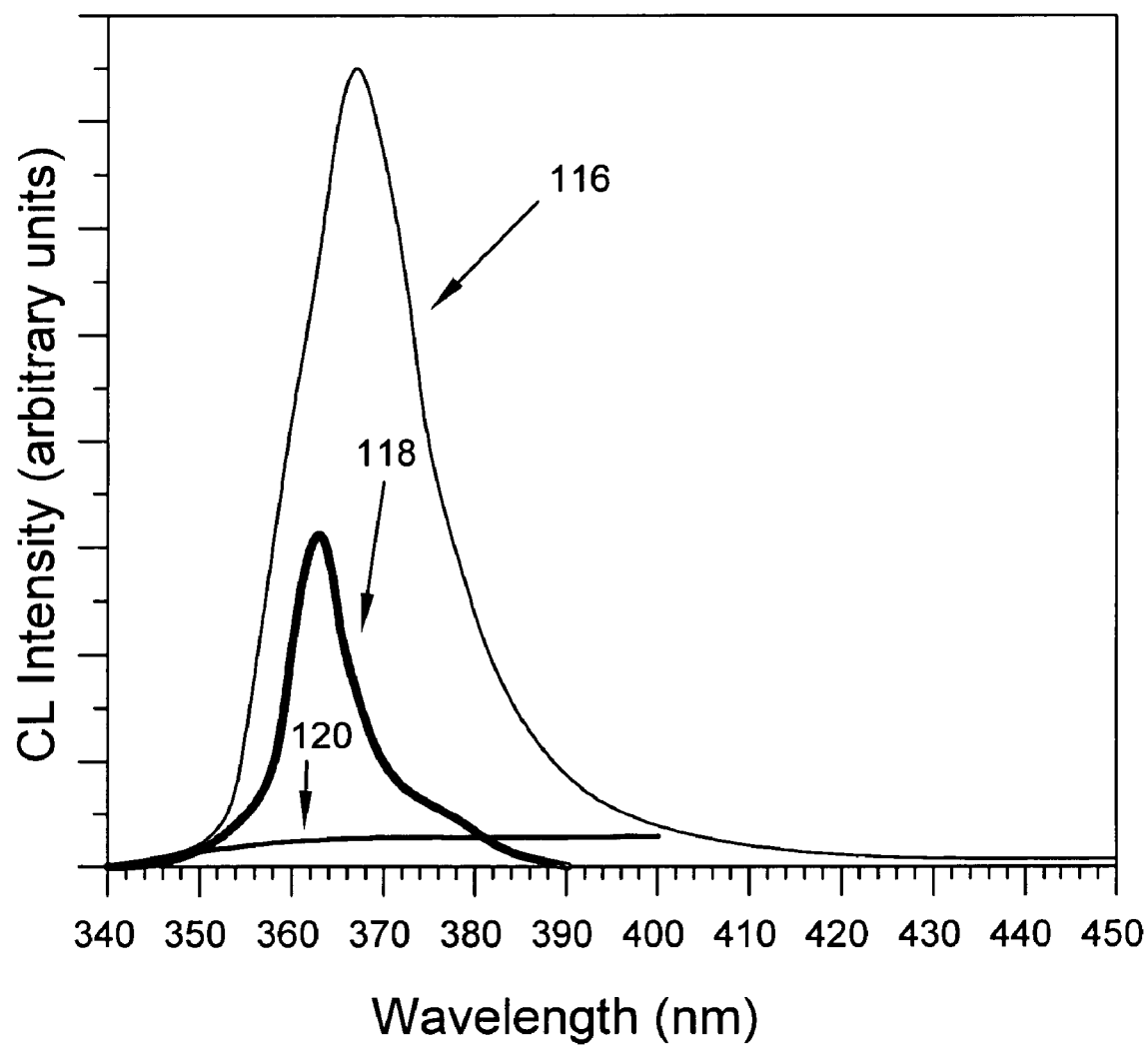
FIG. 5 is a room temperature CL spectra of three different GaN samples: GaN powder synthesized in accordance with a preferred method of the present invention; GaN thin film synthesized by HVPE; and commercially produced GaN powder.

Room temperature CL measurements were performed on the improved GaN powder, a commercially produced GaN powder sample and the brightest known HVPE GaN thin film. A chart showing the results of CL analysis is shown in FIG. 5. A spectrum 116 of the improved GaN powder is very similar to that obtained using PL, with the near band-edge emission located at 370 nm. The approximately 420 nm emission, however, was weaker than in the PL spectrum, which suggests that this band is saturated under high excitation conditions. The CL intensity of the improved GaN powders was three times more intense than the brightest HVPE GaN thin film of spectrum 118. The commercial GaN material measurements 120 differed greatly, and so different spectrometer slit widths were used. Taking this into account, the improved GaN powder is believed to be about 10,000 times brighter than the commercially synthesized material.

The above presents the best mode contemplated for carrying out the present invention, and a manner and process of making and using it. This invention is, however, susceptible to modifications and alternate constructions from that discussed above that are fully equivalent. Consequently, this invention is not limited to the particular embodiments disclosed. On the contrary, this invention covers all modifications and alternate constructions coming within the spirit and scope of the invention as generally expressed by the following claims.

We claim:

1. A method for making gallium nitride, said method comprising the steps of:
    subjecting gallium to a temperature between 100° C. and 700° C. in an ammonia flow to dissolve ammonia in the gallium; and then
    increasing the temperature to between 1000° C. and 1200° C. to react the ammonia with the gallium to produce a porous, crystalline structure characterized by:
        hexagonal columnar micro-crystals having a first distribution in size, and
        hexagonal platelets having a second distribution in size, wherein the first distribution is larger than the second distribution, and
        wherein both the micro-crystals and the platelets have a well defined wurtzite crystalline structure.

2. The method of claim 1, wherein said subjecting step is carried out for approximately 5 minutes to 2 hours.

3. The method of claim 2, wherein said subjecting step produces a gallium-ammonia solution and wherein said solution is heated at 1000° C. to 1200° C. for approximately one hour.

4. The method of claim 1, wherein said crystalline structure is characterized by the absence of a broad emission around 2.214 eV (yellow luminescence).

5. The method of claim 1, wherein the large distribution is approximately 10μ to 30μ and the small distribution is approximately 0.5μ to 2.0μ.

6. Gallium nitride powder comprising:
    hexagonal columnar micro-crystals having a first distribution in size, and
    hexagonal platelets having a second distribution in size, wherein the first distribution is larger than the second distribution, and
    wherein both the micro-crystals and the platelets have a wurtzite crystalline structure.

7. The gallium nitride powder of claim 6 in wherein the columnar micro-crystals occur in a single crystal orientation.

8. The gallium nitride powder of claim 6 in wherein the crystalline structure is characterized by the absence of a broad emission around 2.214 eV (yellow luminescence).

9. The gallium nitride powder of claim 6 in wherein the large distribution is approximately 10μ to 30μ and the small distribution is approximately 0.5μ to 2.0μ.

* * * * *